(12) United States Patent
Müller

(10) Patent No.: US 11,420,521 B2
(45) Date of Patent: Aug. 23, 2022

(54) ARRANGEMENT WITH BATTERY SYSTEM FOR PROVIDING ELECTRIC ENERGY TO A VEHICLE

(71) Applicant: Bombardier Transportation GmbH, Berlin (DE)

(72) Inventor: Rolf Müller, Darmstadt (DE)

(73) Assignee: Bombardier Transportation GmbH, Berlin (DE)

( * ) Notice: Subject to any disclaimer, the term of this patent is extended or adjusted under 35 U.S.C. 154(b) by 815 days.

(21) Appl. No.: 16/073,476

(22) PCT Filed: Jan. 26, 2017

(86) PCT No.: PCT/EP2017/051675
§ 371 (c)(1),
(2) Date: Jul. 27, 2018

(87) PCT Pub. No.: WO2017/129693
PCT Pub. Date: Aug. 3, 2017

(65) Prior Publication Data
US 2019/0031042 A1    Jan. 31, 2019

(30) Foreign Application Priority Data
Jan. 29, 2016 (GB) .................................. 1601649

(51) Int. Cl.
*B60L 3/00* (2019.01)
*H02J 50/10* (2016.01)
(Continued)

(52) U.S. Cl.
CPC .............. *B60L 3/0092* (2013.01); *B60L 53/12* (2019.02); *B60L 58/10* (2019.02); *H02J 7/0026* (2013.01);
(Continued)

(58) Field of Classification Search
CPC ................. Y02T 10/70; Y02T 10/7072; B60L 2240/549; B60L 2240/545; B60L 58/12; B60L 58/22; B60L 58/15; B60L 58/21
See application file for complete search history.

(56) References Cited

U.S. PATENT DOCUMENTS 5,703,464 A    12/1997 Karunasiri et al.
2005/0228619 A1* 10/2005 Burnet ..................... G05B 9/03
702/189

(Continued)

*Primary Examiner* — Drew A Dunn
*Assistant Examiner* — Tarikh Kanem Rankine
(74) *Attorney, Agent, or Firm* — The Webb Law Firm

(57) ABSTRACT

A method of operating a battery system for providing electric energy to a vehicle. Sensor signals representing physical quantities of individual cells and/or individual modules of at least one battery of the battery system are generated. The sensor signals are transferred to a first and a second system controller. Both the first and second system controller evaluates the sensor signals and controls the battery system, depending on corresponding evaluation results. The first system controller is operated in combination with a first monitoring device and the second system controller is operated in combination with a second monitoring device. The first monitoring device monitors an operation of the second system controller and the second monitoring device monitors an operation of the first system controller. Depending on monitoring results of the first monitoring device and of the second monitoring device, the battery system is controlled.

17 Claims, 2 Drawing Sheets

(51) Int. Cl.
  *H02J 7/00* (2006.01)
  *B60L 58/10* (2019.01)
  *B60L 53/12* (2019.01)
  *H02J 7/02* (2016.01)
  *G01R 31/396* (2019.01)

(52) U.S. Cl.
  CPC .......... *H02J 7/0029* (2013.01); *H02J 7/0031* (2013.01); *H02J 7/0047* (2013.01); *H02J 7/025* (2013.01); *H02J 50/10* (2016.02); *B60L 2240/545* (2013.01); *B60L 2240/547* (2013.01); *B60L 2240/549* (2013.01); *B60Y 2200/91* (2013.01); *G01R 31/396* (2019.01); *Y02T 10/70* (2013.01); *Y02T 10/7072* (2013.01); *Y02T 90/12* (2013.01); *Y02T 90/14* (2013.01)

(56) References Cited

U.S. PATENT DOCUMENTS

| | | | |
|---|---|---|---|
| 2006/0074500 A1* | 4/2006 | Naik | G05B 9/03 700/21 |
| 2011/0254502 A1* | 10/2011 | Yount | B60L 3/0092 320/107 |
| 2012/0065823 A1* | 3/2012 | Taguchi | B60L 3/0061 701/22 |
| 2013/0116876 A1* | 5/2013 | Park | B60L 3/0015 701/22 |
| 2013/0131904 A1* | 5/2013 | Park | B60L 15/20 701/22 |
| 2013/0338871 A1* | 12/2013 | Kubo | B60L 3/0046 701/29.2 |
| 2013/0346783 A1 | 12/2013 | Weber et al. | |
| 2014/0108896 A1* | 4/2014 | Jung | B60W 50/02 714/819 |
| 2014/0175874 A1* | 6/2014 | Stimm | B60L 58/21 307/10.7 |
| 2014/0212714 A1* | 7/2014 | Butzmann | B60L 58/21 429/90 |
| 2015/0205650 A1* | 7/2015 | Shimada | G06F 11/008 714/703 |
| 2015/0236529 A1* | 8/2015 | Tanaka | B60L 58/15 320/109 |
| 2015/0325886 A1* | 11/2015 | Butzmann | H04Q 9/00 429/7 |
| 2015/0333541 A1* | 11/2015 | Butzmann | B60L 58/16 320/112 |
| 2016/0033581 A1* | 2/2016 | Sunaga | B60L 3/0092 324/434 |
| 2016/0059712 A1* | 3/2016 | Jang | B60L 3/0092 307/10.1 |
| 2016/0193973 A1* | 7/2016 | Rupp | B60L 3/04 701/29.2 |
| 2017/0131698 A1* | 5/2017 | Hatakeyama | B60L 3/0092 |
| 2018/0093579 A1* | 4/2018 | Fukushima | G08G 1/168 |
| 2018/0198289 A1* | 7/2018 | Sugeno | H02J 7/0029 |
| 2018/0208236 A1* | 7/2018 | Asao | H02P 29/0241 |

* cited by examiner

ARRANGEMENT WITH BATTERY SYSTEM FOR PROVIDING ELECTRIC ENERGY TO A VEHICLE

CROSS-REFERENCE TO RELATED APPLICATIONS

This application is the United States national phase of International Application No. PCT/EP2017/051675 filed Jan. 26, 2017, and claims priority to United Kingdom Patent Application No. 1601649.5 filed Jan. 29, 2016, the disclosures of which are hereby incorporated in their entirety by reference.

BACKGROUND OF THE INVENTION

Field of the Invention

The invention relates to a method of operating a battery system for providing electric energy to a vehicle. Furthermore, the invention relates to an arrangement for providing electric energy to a vehicle, the arrangement comprising such a battery system.

Description of Related Art

In recent years, chargers have been developed which charge battery systems at higher power levels as before in order to reduce the time required for charging the battery or batteries of the battery system. One option for charging the battery system requires at least one electric charging cable for transferring electric energy. However, in recent years, inductive charging systems have been proposed which do not require a point to point cable connection from the energy source to the battery system. Rather, the energy source is connected to a primary side generating device which generates a magnetic field or an electromagnetic field and the magnetic field or the magnetic component of the field induces an electric voltage in a secondary side receiving device that is connected to the battery system. In this case, a vehicle comprising the secondary side receiving device may drive to the location of the primary side generating device so that the primary side device and the secondary side device are arranged in close proximity and the charging process may begin. Alternatively, the primary side generating device may extend along the path of travel and may generate the electromagnetic field continuously while the vehicle travels and the on-board device converts the energy transferred with the electromagnetic field into electric energy.

Typically, the electric voltage induced in the receiving device is an alternating voltage. A corresponding alternating charging current is rectified and the rectified current is used to charge the battery or batteries of the battery system.

The battery system may be a high voltage vehicle battery system which means that the nominal operating voltage of the system is above conventional nominal voltages in vehicles, such as 12 Volt. High nominal voltages of on-board battery systems may be at the level of 24 Volt, 42 Volt or even higher, such as 110 Volt.

Especially high voltage battery systems require high levels of operating safety. Malfunctioning battery cells might rapidly heat up due to the corresponding high charging power required for fast charging. In particular, a cell or module may malfunction if it has been damaged by external influences or during manufacture or installation. In addition or alternatively, the life span of the cell or module may have come to an end.

SUMMARY OF THE INVENTION

It is therefore an object of the present invention to provide a method of operating a battery system for providing electric energy to a vehicle and/or to provide an arrangement for providing electric energy to a vehicle which have a high level of operating safety.

In particular, the battery system may comprise modules, each module comprising a plurality of battery cells. Several modules may form a battery. More generally speaking, each battery comprises a plurality of battery cells and the battery system has at least one battery.

The battery system comprises electric connections via which the battery or batteries of the system can be charged and discharged. In particular, the battery system may be connected to a charger (such as the secondary side receiving device of the inductive charging system mentioned above) via a rectifier and a further electric connection connects the battery system to the on-board electric network of the vehicle.

Switchable contactors allow for electrically separating the battery or batteries and/or modules from the on-board electric system of the vehicle. These contactors can be controlled by at least one system controller of the battery system. In case of a malfunction, the system controller controls the contactor to be switched off so that the corresponding module or battery is disconnected.

The individual battery cells and/or battery modules of the battery system are combined with in each case at least one sensor and preferably with at least two sensors measuring the temperature and/or electric voltage of the cell or module. The corresponding sensor signals are transferred to the system controller for evaluation. In particular by using computerized evaluation routines, the measurement values transferred by the sensor signals are processed. This enables the system controller to control the charging and discharging of the battery system, for example by controlling the charging current or discharging current. In addition, the system controller can detect a malfunction of a cell or module.

In order to increase safety of the battery system, a first system controller and a second system controller are used and both system controllers receive and evaluate the same sensor signals, in particular in the same manner. Therefore, a fully redundant reception and evaluation of all sensor signals generated by all sensors of the battery system can be realized. In addition or alternatively, the first system controller and the second system controller, can be diverse, i.e. their functions (which may be identical and/or not) can be implemented in different manners. The different implementations increase safety.

In particular, each system controller is capable of initiating measures in case of malfunctioning, such as electrically disconnecting the malfunctioning cell or module, reducing the charging power or discharging power and/or restricting the operating times of the battery system, module(s) or cell(s). These and other operating states can be named "safe state".

In particular, self-testing routines including self-diagnosis may be implemented in the first and second system controller. In this manner, operating errors, such as defects of electronic devices and errors in operating routines of the controller, can be detected by the system controller itself.

In order to increase the safety level even more, it is proposed that a first monitoring device and a second monitoring device are provided. Each of these devices is combined with one of the system controllers. For example, each of these devices may be integrated in one of the system controllers or may be combined with one of the system controllers as a separate device. Each of the monitoring devices is adapted to monitor an operation of the other system controller, in particular taking into account the operation of the system controller in which the monitoring device is integrated or with which the monitoring device is combined. For example with respect to the first monitoring device which is integrated in the first system controller or which is connected with the first system controller, this means that the first monitoring device monitors the operation of the second system controller, preferably taking the operation of the first system controller into account.

More generally speaking, the first and second system controllers are directly or indirectly (e.g. via the respective monitoring device) connected to each other for transferring signals and they and/or the respective monitoring devices are capable of monitoring the operation of the respective other system controller.

In particular, the monitoring procedure performed by the respective monitoring device may include
- comparing the sensor signals received and/or processed by the first and second system controller and/or,
- monitoring self-test and/or self-diagnosis routines and/or comparing results of self-test and/or self-diagnosis routines of the first and second system controllers and/or
- comparing information within the first and second system controller concerning at least one of the sensors combined with batteries cells and/or battery modules (in particular information with respect to threshold values, such as threshold values for operating temperatures and/or operating voltages) and/or
- comparing and/or analyzing information about operating procedures performed by the first and second system controllers and/or
- checking if procedures performed by the first and second system controllers are performed correctly (such as procedures of using data storages and/or sets of instructions used during a procedure).

These monitoring functions increase the safety of operating the battery system significantly.

In addition or alternatively, at least one of the monitoring devices can be adapted to trigger and/or control the other system controller (the operation of which is monitored by the monitoring device) to perform at least one procedure and to evaluate respective feedback signals from the other system controller. The triggering or control can be performed by assigning at least one task of operation to the other system controller, so that the task is performed by the system controller. For example, the first monitoring device which is integrated in the first system controller or is combined with the first system controller, triggers and/or controls the second system controller.

In particular, the concept of using first and second monitoring devices allows for reliably determining a malfunctioning cell or module of cells of the battery system, even if one of the at least two system controller is malfunctioning. In addition, the concept enables detecting further potential errors (including dormant and/or systematic errors) of the electric constitution, of electronic devices, of sensors and of operating routines (especially using software) of the battery system. As mentioned above, different safe states can be defined so that the reaction on the detection of an error or malfunctioning can be made dependent on the kind of error or malfunctioning, in particular dependent on its severity. In particular, the operation time can be restricted and/or the power of charging and/or discharging can be limited and/or reduced first and then, as a second measure in case of a higher level of severity, a module or battery or all batteries of the battery system can be electrically disconnected.

In particular, the monitoring principles mentioned above can be realized by two independent microprocessors. Each of the processors may be integrated in one of the first and second system controllers. Alternatively, microprocessors can be used as part of monitoring devices realized as devices separated, in particular spatially separated from the system controller with which the respective monitoring device is combined. In addition or alternatively, the monitoring devices may be powered by different current and/or voltage sources. In particular, the first monitoring device may be powered by a different current and/or voltage source than the second monitoring device. Moreover, the first monitoring device may be powered by a different current and/or voltage source than the first system controller. Moreover, the second monitoring device may be powered by a different current and/or voltage source than the second system controller.

In particular, the following is proposed: A method of operating a battery system for providing electric energy to a vehicle, wherein
- sensor signals representing physical quantities (in particular electric quantities, such as the voltage, current and/or power, and/or terminal quantities, such as cell temperature, module temperature and/or battery temperature) of individual cells and/or individual modules of at least one battery of the battery system are generated,
- the sensor signals are transferred to a first system controller and to a second system controller,
- both the first system controller and the second system controller evaluates the sensor signals and controls the battery system, depending on corresponding evaluation results,
- the first system controller is operated in combination with a first monitoring device and the second system controller is operated in combination with a second monitoring device,
- the first monitoring device monitors an operation of the second system controller and the second monitoring device monitors an operation of the first system controller,
- depending on monitoring results of the first monitoring device and of the second monitoring device, the battery system is controlled.

Furthermore, an arrangement for providing electric energy to a vehicle is proposed, the arrangement comprising a battery system for storing energy and for delivering stored energy, wherein:
- the battery system comprises a plurality of battery cells,
- the battery system comprises a plurality of sensors adapted to generate sensor signals representing physical quantities of individual battery cells and/or individual battery modules of the battery system,
- the battery system comprises a first system controller and a second system controller,
- the battery system comprises signal connections from the plurality of sensors to the first system controller and the second system controller for transferring the sensor signals, both the first system controller and the second system controller are adapted to evaluate the sensor signals and to control the battery system, depending on corresponding evaluation results, the first system controller is combined with a first monitoring device and the second system controller is combined with a second monitoring device, the first monitoring device is adapted to monitor an operation of the second system controller and the second monitoring device is adapted to monitor an operation of the first system controller, the battery system is adapted to control the battery system depending on monitoring results of the first monitoring device and of the second monitoring device.

In particular, if the monitoring results fulfil a predefined condition, an electric power delivered by the battery system to an electric consumer of the vehicle may be reduced, an operation time of the battery system while the battery system delivers electric power to an electric consumer of the vehicle may be restricted and/or an electric connection from the battery system to a charger and/or to an electric consumer of the vehicle may be switched off (i.e. opened). Therefore, a corresponding safe state of the battery system can be achieved depending on the monitoring results. The first monitoring device and/or the second monitoring device may be adapted to trigger the corresponding safe state and/or to control initiating the corresponding safe state depending on the monitoring results.

In particular, while monitoring the operation of the first and second system controller, the first monitoring device and/or the second monitoring device may compare evaluation results from an evaluation of the sensor signals performed by the second system controller with evaluation results from an evaluation of the sensor signals performed by the first system controller. According to this embodiment of the method, safety of processing the measurement values and safety of detecting errors is increased.

The invention also includes a vehicle comprising (a) an on-board electric network, (b) any embodiment of the arrangement, wherein the battery system is electrically connected to the electric network, and (c) a charger for charging the battery system.

According to a preferred embodiment of the method, the first system controller and/or the second system controller
determine(s) from a desired operation of charging the battery system a desired value of a charging voltage and output(s) information about the desired value to a charging controller,
evaluate(s) the sensor signals and/or an electric charging current used to charge the battery system and generate(s) a corresponding evaluation result,
determine(s), by taking the desired operation of charging the battery system into account, whether a predetermined criterion indicating a significant deviation from the desired operation is fulfilled,
control(s) an electric connection from the battery system to a secondary side receiving device of an inductive power transfer system, the receiving device functioning as a charger charging the battery system, to be switched off if the predetermined criterion is fulfilled.

According to a corresponding embodiment of the arrangement, the first system controller and/or the second system controller is/are adapted to perform the method.

These embodiments relate to inductive charging systems as mentioned above. For different reasons, the operation of the secondary side receiving device may differ from the desired operation of charging the battery system. In particular if the charging voltage and, therefore, the charging current is too large, battery cells of the battery system may be heated up to temperatures above a maximum allowed temperature level. In addition or alternatively, the lifetime of battery cells may be reduced by inappropriate charging currents.

The operation of inductive charging systems depends on additional operation parameters compared to all electric charging systems. In particular, the inductive coupling between the primary side generating device and the secondary side receiving device may vary. For example, the vehicle having the receiving device on board may be positioned differently in different charging procedures. In addition, foreign objects not belonging to the inductive charging system, such as metal objects, may suddenly enter the space in between the primary side generating device and the secondary side receiving device, thereby suddenly reducing the inductive coupling. On the other hand, the inductive coupling may suddenly be increased if a foreign object leaves the space and/or if the alignment and/or relative position of the primary side generating device and the secondary side receiving device is improved.

Since the inductive charging system's operational state may vary, the electric charging power provided by the secondary side receiving device to the battery system may also vary and may significantly deviate from the desired operation of charging the battery system. Therefore, the embodiments of the method and of the arrangement mentioned above increase operational safety of the battery system.

Information on charging characteristics, for example in the form of the charging voltage as a mathematical function of operational parameters such as charging state and temperature, may be stored in the battery system so that the system controllers of the battery system have access to this information. In particular from such a mathematical function, the first and/or second system controller may determine the desired value of the charging voltage repeatedly, in particular regularly, based on information on currently valid operation parameters. Also the evaluation of the sensor signals and/or of the electric charging current and the determination whether the predetermined criterion is fulfilled may be performed repeatedly, in particular regularly by the control device(s). For example, the control device(s) perform(s) these actions in regular operational cycles with a given cycle frequency. If it is determined that the predetermined criterion is fulfilled in any of the repetitions, the electric connection to the secondary side receiving device is interrupted, for example by opening a corresponding switch.

One possibility for the system controller(s) is to evaluate the sensor signals of the sensors which are assigned to the individual cells or modules. In particular, these sensors may measure the cell voltage or module voltage and the system controller(s) may calculate the total voltage applied to the battery system from the sensor signals and may compare this measured and calculated total voltage with the desired charging voltage. In addition or alternatively, the total electric charging current or part of the total electric charging current which is used to charge the battery system may be measured. From this measured information, the system controller(s) may calculate the corresponding charging voltage, taking into account information on the electrical properties of the battery system (like the internal resistance) and/or taking into account the charging characteristics, and may compare the result(s) with the desired operation of charging the battery system.

The predetermined criterion may include a criterion concerning a deviation between the desired charging operation and the current charging operation based on the determination result made by the control device(s). For example, the deviation (e.g. difference) between the desired value of the charging voltage and the current value of the charging voltage is compared with a predefined threshold value and the criterion is fulfilled if the deviation is equal to the threshold value, or alternatively, if the deviation is equal to or larger than the threshold value.

In addition or alternatively, the predetermined criterion may consider not only the sensor signals and/or the measured charging current at one point in time (or of one repetition of the actions performed by the control device(s). Rather, the sensor signals and/or measured charging current values over a time interval of predetermined lengths may be taken into account when determining whether the predetermined criterion is fulfilled. For example, the deviation mentioned above must exceed the threshold value over the time interval so that the criterion is fulfilled. Otherwise, the predetermined criterion is not fulfilled.

The first and/or second system controller may perform the steps mentioned above in connection with the charging voltage and the criterion in addition to the other evaluation of the sensor signals mentioned before.

In particular, the criterion can be predetermined in such a manner that it can be fulfilled before a cell temperature of one of the battery cells exceeds a predetermined threshold value. This means that a failure of the inductive charging system cannot damage the battery cells. The system controller(s) of the battery system will notice the failure and will switch off the electric connection before a battery cell temperature has reached a critical threshold value.

The embodiment of the method, which includes the determination whether the predetermined criterion is fulfilled, can be performed by a battery system having a single system controller only and having only one or none of the monitoring devices. However, it is preferred to use the redundant battery system structure described above and below, since this establishes operational safety at a higher safety level. The redundancy structure can also be used to monitor the operation of the system controllers in connection with the predetermined criterion.

BRIEF DESCRIPTION OF THE DRAWINGS

Examples of the invention will be described with reference to the attached figures in the following. The figures show.

DESCRIPTION OF THE INVENTION

Figure 1:
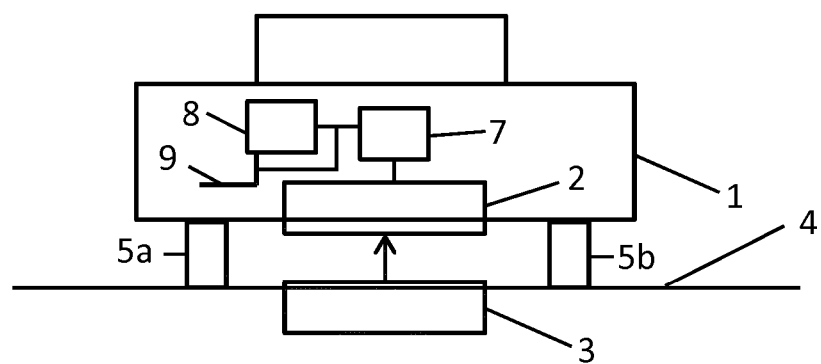
FIG. 1 schematically a front view of an inductive power transfer system with a primary side conductor assembly buried in the ground and a vehicle having a secondary side receiving device, FIG. 2 schematically a battery system which is controlled by two redundant system controllers, FIG. 3 schematically a secondary side receiving device of an inductive charging system, connecting to a direct current intermediate circuit to which the electric network and the battery system of the vehicle are connected.

The vehicle 1 which is schematically shown in FIG. 1 comprises a secondary side receiving device 2 for receiving an electromagnetic field produced by a primary side conductor assembly 3 which is buried in the ground. For example, the vehicle 1 drives on wheels 5a, 5b on the surface 4 of the ground (in particular on a road). Alternatively, the wheels may roll on rails during operation, if the vehicle is a rail vehicle.

The primary side conductor assembly 3 produces the electromagnetic field, for example while the vehicle is driving. Alternatively, the vehicle 1 may stop or may be parked while the electromagnetic field energy is transferred to the receiving device 2 of the vehicle.

The secondary side receiving device 2 is connected to a battery system 8 via a rectifier 7. The battery system 8 is connected to an electric network 9 of the vehicle 1.

Figure 2:
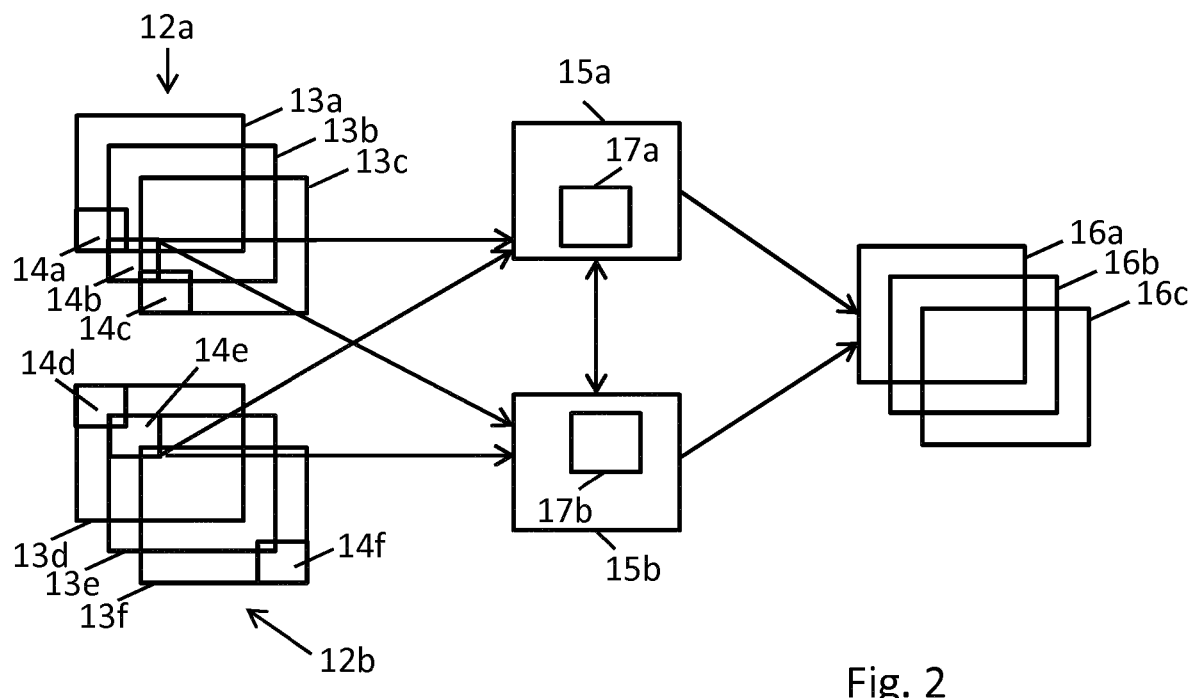

FIG. 2 shows a battery system comprising two modules 12a, 12b, each comprising a plurality of battery cells 13a-13c, 13d-13f. The modules 12a, 12b form a battery. For example, the battery cells 13 are electrically connected in series to each other so that the cell voltage is added to form the module voltage. However, in addition or alternatively, the cells of the same module may be connected in parallel to each other.

Each cell 13 is combined with a sensor or set of sensors 14. In particular there is at least one temperature sensor for each cell for measuring the cell temperature and there is at least one voltage sensor for measuring the voltage of the cell.

As indicated by arrows, the sensor signals from the sensors 14 are transferred to a first system controller 15a and to a second system controller 15b. Both system controllers 15 receive the same sensor signals. In particular, the sensors 14 measure the respective quantity repeatedly and the sensor signals are also repeatedly transferred to the system controllers 15.

For example, the system controllers 15a, 15b each evaluate the sensor signals and operate the battery system depending on the evaluation results. In particular, the charging voltage applied to the battery system may be controlled by the system controllers 15 during charging of the battery system. Furthermore, the system controllers 15 may perform routines for determination whether the operation of the individual cells corresponds to an expected operation. For example, the cell temperature and the cell voltage are evaluated as functions of time and deviations of the expected behavior of the cell are determined. In addition or alternatively, each system controller 15 may check the received sensor measurement values for plausibility. For example, abrupt changes of the cell temperature or the cell voltage can be determined as non-plausible and it can be decided that the respective sensor is malfunctioning.

It may happen that the operation of the different system controllers 15a, 15b produces different results, although the received sensor signals are identical or because the received sensor signals are not identical. One reason for different operation results is a malfunction of the system controller itself. Another reason is a defect signal line from the sensor to the system controller.

These different operation results, including any different operation behavior of the first and second system controller 15a, 15b, can be detected by monitoring the system controllers 15. Therefore, each of the two system controllers 15a, 15b is combined with a monitoring device 17a, 17b. The first monitoring device 17a monitors the operation of the second system controller 15b and the second monitoring device 17b monitors the operation of the first system controller 15a. In addition, the first monitoring device 17a has access to information about the operation of the first system controller 15a. In particular, it may also monitor the operation of the first system controller 15a in the same manner as it is monitoring the operation of the second system controller 15b. The same applies to the second monitoring device 17b with respect to its access to information about the operation of the second system controller 15b.

Each of the monitoring devices 17a, 17b is capable of detecting differences between the operation and in particular the operation results of both system controllers 15a, 15b. Therefore, the monitoring device can initiate any measure of reacting to such a difference. Optionally, the monitoring device may analyze the difference for possible reasons. In particular, it may determine that the operation of one of the system controllers is more likely based on a failure than the operation of the other system controller.

In particular, the monitoring device 17 may trigger and/or control the operation of an actuation device 16a, 16b, 16c which brings the battery system or a part of the battery system (such as one of the modules 12a, 12b or one of the cells 13) in a safe state. For example at least one of the actuation devices 16 may be a contactor which can be opened so that an associated cell or module is electrically disconnected from its electric connection to other parts of the battery system or to external devices.

Optionally, the monitoring devices 17a, 17b can monitor each other. For example, the monitoring devices 17 may compare differences of the operations of the system controllers 15 which have been determined by the monitoring devices 17. If at least one of the monitoring devices determines that the determined operation differences are the same, it is likely that the operation of the monitoring devices is error-free. Otherwise, it can optionally be analyzed which of the monitoring devices may have a malfunction or operates based on corrupted information. The monitoring device producing the deficient monitoring result may be disabled.

Figure 3:
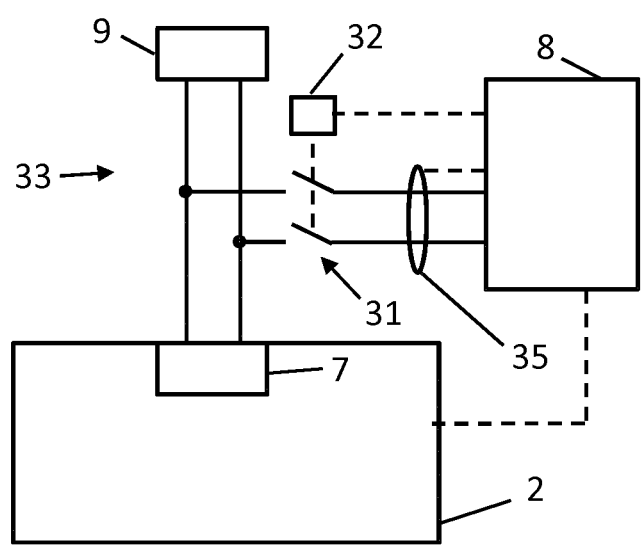

The components shown in FIG. 3 are partly components having the same reference numeral as in FIG. 1. This means that the arrangement shown in FIG. 3 may be an example of the arrangement shown in FIG. 1.

In this example, the rectifier 7 is part of the same module as the receiving device 2. The rectifier 7 is connected to two direct current lines operated at different electric potentials and these lines form a direct current intermediate circuit 33.

The vehicle's on board electric network 9 is symbolized by a rectangle. The electric network 9 and the battery system 8 are connected to the direct current intermediate circuit 33. However, the battery system 8 can be disconnected from the direct current intermediate circuit 33 by opening a switch 31 which acts on two direct connection lines connecting the battery system 8 to the two lines of the direct current intermediate circuit 33. The switch 31 is controlled by a switch control 32 which in turn is controlled by the system controller(s) of the battery system 8. The system controller(s) is/are not shown in FIG. 3. A current sensor 35 is combined with at least one of the two connection lines and measures during the charging of the battery system 8 the charging current. As indicated by dashed lines, the switch control 32 and the current sensor 35 are connected to the system controller(s) of the battery system 8 in order to transfer signals.

During operation of the secondary side receiving device 2, it may charge the battery system 8. In this case the switch 31 is closed and the battery system 8 is connected to the direct current intermediate circuit 33. The direct charging current flows from the rectifier 7 through the connection lines to the battery system 8. A system controller of the battery system 8 is connected (as indicated by a dashed line) with a controller of the receiving device 2. This controller is part of the receiving device 2, but is not shown in FIG. 3.

The system controller of the battery system 8 outputs information about the desired charging voltage to the controller of the receiving device 2 and, during normal operation, the receiving device 2 produces the desired charging voltage at the connections of the rectifier 7 to the direct current intermediate circuit 33.

The system controller of the battery system 8 repeatedly evaluates the measurement values produced by the current sensor 35 in order to monitor the charging current. It further determines whether the measured charging current corresponds to the desired charging voltage. If there is a significant deviation between the desired charging operation and the current charging operation, and if this significant deviation fulfils a predetermined criterion, the system controller of battery system 8 controls the switch control 32 to open the switch 31.

Modifications and alternatives of the example shown in FIG. 3 follow from the general description of the method and arrangement above. In particular, the at least one system controller of the battery system may evaluate the sensor signals of the sensors associated with the battery cells in order to repeatedly determine whether the predetermined criterion is fulfilled. In addition, or alternatively, both system controllers of the battery system may operate in the same manner by determining and outputting information about the desired value of the charging voltage to the receiving device, by evaluating the sensor signals and/or the measured values of the current sensor, by determining, whether a predetermined criterion indicating a significant deviation from the desired operation is fulfilled, and by controlling the contactor to disconnect the battery system from the receiving device if the predetermined criterion is fulfilled. Other than shown in FIG. 3, the switch may be located at the output of the rectifier, so that the rectifier may be disconnected from not only the battery system, but also from the on-board electric network.

As a further option or alternative operation, prior to switching off the connection of the battery system to the direct current intermediate circuit, the system controller(s) or the battery system may communicate to the receiving device a message in case the evaluation results from evaluating the sensor signals and/or the electric charging current indicates a deviation from the desired operation. For example, a first predetermined criterion may be defined and the system controller(s) output(s) a signal to the receiving device if the first criterion is fulfilled. There may be a second predetermined criterion defined which is not necessarily fulfilled if the first criterion is fulfilled. If the signals transferred from the system controller(s) to the receiving device do not result in the desired charging operation, the system controller(s) may decide that the second criterion is fulfilled and that the contactor is to be opened. Alternatively, fulfilling the second criterion may require a larger deviation of the current charging operation from the desired operation than for the first criterion.

The invention claimed is:

1. A method of operating a battery system for providing electric energy to a vehicle comprising:
   generating sensor signals representing physical quantities and terminal quantities of individual cells and/or individual modules of at least one battery of the battery system, wherein the physical quantities include electric quantities, and wherein the terminal quantities include temperature,
   transferring the sensor signals to a first system controller and to a second system controller, receiving the sensor signals by the first system controller and by the second system controller, wherein the sensor signals received by the first system controller are the same as the sensor signals received by the second system controller,
evaluating the sensor signals and controlling the battery system by both the first system controller and the second system controller, through corresponding evaluation results,
operating the first system controller in combination with a first monitoring device and operating the second system controller in combination with a second monitoring device,
monitoring an operation of the second system controller by the first monitoring device,
monitoring an operation of the first system controller by the second monitoring device,
detecting, by the first monitoring device and the second monitoring device, a difference in the operation of the first system controller and the operation of the second system controller, and carrying out an action based on detecting the difference, and
controlling the battery system by monitoring results of the first monitoring device and the second monitoring device,
wherein the monitoring procedure performed by the respective monitoring device includes comparing first processed sensor signals, which are sensor signals received and processed by the first system controller, with second processed sensor signals, which are sensor signals received and processed by the second system controller, and
wherein, if the monitoring results fulfil a predefined condition, the method further comprises:
reducing an electric power delivered by the battery system to an electric consumer of the vehicle,
restricting an operation time of the battery system while the battery system delivers electric power to an electric consumer of the vehicle, and/or
switching off an electric connection from the battery system to a charger and/or to an electric consumer of the vehicle.

2. The method of claim 1, wherein, while monitoring the operation of the first and second system controller, at least one of the first monitoring device and/or the second monitoring device compare(s) evaluation results from an evaluation of the sensor signals performed by the second system controller with evaluation results from an evaluation of the sensor signals performed by the first system controller.

3. The method of claim 2, wherein at least one of the first system controller and/or the second system controller determine(s) from a desired operation of charging the battery system a desired value of a charging voltage and output(s) information about the desired value to a charging controller, wherein at least one of the first system controller and/or the second system controller evaluate(s) the sensor signals and/or an electric charging current used to charge the battery system and generate(s) a corresponding evaluation result, wherein at least one of the first system controller and/or the second system controller determine(s), by taking the desired operation of charging the battery system and the evaluation result into account, whether a predetermined criterion indicating a significant deviation from the desired operation is fulfilled and wherein at least one of the first system controller and/or the second system controller control(s) an electric connection from the battery system to a secondary side receiving device of an inductive power transfer system, the receiving device functioning as a charger charging the battery system, to be switched off.

4. The method of claim 1, wherein at least one of the first system controller and/or the second system controller determine(s) from a desired operation of charging the battery system a desired value of a charging voltage and output(s) information about the desired value to a charging controller, wherein at least one of the first system controller and/or the second system controller evaluate(s) the sensor signals and/or an electric charging current used to charge the battery system and generate(s) a corresponding evaluation result, wherein at least one of the first system controller and/or the second system controller determine(s), by taking the desired operation of charging the battery system and the evaluation result into account, whether a predetermined criterion indicating a significant deviation from the desired operation is fulfilled and wherein at least one of the first system controller and/or the second system controller control(s) an electric connection from the battery system to a secondary side receiving device of an inductive power transfer system, the receiving device functioning as a charger charging the battery system, to be switched off.

5. The method of claim 1, wherein, while monitoring the operation of the first and second system controller, at least one of the first monitoring device and/or the second monitoring device compare(s) evaluation results from an evaluation of the sensor signals performed by the second system controller with evaluation results from an evaluation of the sensor signals performed by the first system controller.

6. The method of claim 1, wherein at least one of the first system controller and/or the second system controller determine(s) from a desired operation of charging the battery system a desired value of a charging voltage and output(s) information about the desired value to a charging controller, wherein at least one of the first system controller and/or the second system controller evaluate(s) the sensor signals and/or an electric charging current used to charge the battery system and generate(s) a corresponding evaluation result, wherein at least one of the first system controller and/or the second system controller determine(s), by taking the desired operation of charging the battery system and the evaluation result into account, whether a predetermined criterion indicating a significant deviation from the desired operation is fulfilled and wherein at least one of the first system controller and/or the second system controller control(s) an electric connection from the battery system to a secondary side receiving device of an inductive power transfer system, the receiving device functioning as a charger charging the battery system, to be switched off.

7. An apparatus for providing electric energy to a vehicle, the apparatus comprising a battery system for storing energy and for delivering stored energy, wherein the battery system comprises:
a plurality of battery cells,
a plurality of sensors adapted to generate sensor signals representing physical quantities and terminal quantities of individual battery cells and/or individual battery modules of the battery system, wherein the physical quantities include electric quantities, and wherein the terminal quantities include temperature,
a first system controller and a second system controller, a first monitoring device and a second monitoring device,
connections from the plurality of sensors to the first system controller and the second system controller for transferring the sensor signals, wherein:
both the first system controller and the second system controller are adapted to evaluate the sensor signals and to control the battery system, depending on corresponding evaluation results,
both the first system controller and the second system controller are adapted to receive the sensor signals generated by the plurality of sensors, wherein the sensor signals received by the first system controller are the same as the sensor signals received by the second system controller,
the first system controller is combined with the first monitoring device and the second system controller is combined with the second monitoring device,
the first monitoring device is adapted to monitor an operation of the second system controller and the second monitoring device is adapted to monitor an operation of the first system controller,
the first monitoring device and the second monitoring device are adapted to detect a difference in the operation of the first system controller and the operation of the second system controller and carry out an action based on detecting the difference,
the battery system is adapted to control the battery system depending on monitoring results of the first monitoring device and of the second monitoring device, and
the respective monitoring device is adapted to perform the monitoring procedure including comparing first processed sensor signals, which are sensor signals received from the plurality of sensors and processed by the first system controller, with second processed sensor signals, which are sensor signals received from the plurality of sensors and processed by the second system controller,
wherein at least one of the first monitoring device and/or the second monitoring device is/are adapted to trigger and/or initiate, if the monitoring results fulfil a predefined condition, reducing an electric power delivered by the battery system to an electric consumer of the vehicle, restricting an operation time of the battery system while the battery system delivers electric power to an electric consumer of the vehicle, and/or switching off an electric connection from the battery system to at least one of a charger and/or to an electric consumer of the vehicle.

8. The apparatus of claim 7, wherein at least one of the first monitoring device and/or the second monitoring device is/are adapted to compare evaluation results from an evaluation of the sensor signals performed by the second system controller with evaluation results from an evaluation of the sensor signals performed by the first system controller.

9. The apparatus of claim 8, wherein at least one of the first system controller and/or the second system controller is/are adapted to:
determine from a desired operation of charging the battery system a desired value of a charging voltage and to output information about the desired value to a charging controller,
evaluate the sensor signals and/or an electric charging current used to charge the battery system and generate a corresponding evaluation result,
determine, by taking the desired operation of charging the battery system and the evaluation result into account, whether a predetermined criterion indicating a significant deviation from the desired operation is fulfilled and control an electric connection from the battery system to a secondary side receiving device of an inductive power transfer system, the receiving device functioning as a charger charging the battery system, to be switched off.

10. A vehicle comprising:
an on-board electric network,
the apparatus of claim 8, wherein the battery system is electrically connected to the electric network, and
a charger for charging the battery system.

11. The apparatus of claim 7, wherein at least one of the first system controller and/or the second system controller is/are adapted to: determine from a desired operation of charging the battery system a desired value of a charging voltage and to output information about the desired value to a charging controller, evaluate the sensor signals and/or an electric charging current used to charge the battery system and generate a corresponding evaluation result, determine, by taking the desired operation of charging the battery system and the evaluation result into account, whether a predetermined criterion indicating a significant deviation from the desired operation is fulfilled and control an electric connection from the battery system to a secondary side receiving device of an inductive power transfer system, the receiving device functioning as a charger charging the battery system, to be switched off.

12. A vehicle comprising:
an on-board electric network,
the apparatus of claim 11, wherein the battery system is electrically connected to the electric network, and
a charger for charging the battery system.

13. A vehicle comprising:
an on-board electric network,
the apparatus of claim 7, wherein the battery system is electrically connected to the electric network, and
a charger for charging the battery system.

14. The vehicle of claim 13, wherein the vehicle further comprises a secondary side receiving device of an inductive power transfer system as the charger.

15. The apparatus of claim 7, wherein at least one of the first monitoring device and/or the second monitoring device is/are adapted to compare evaluation results from an evaluation of the sensor signals performed by the second system controller with evaluation results from an evaluation of the sensor signals performed by the first system controller.

16. The apparatus of claim 7, wherein at least one of the first system controller and/or the second system controller is/are adapted to:
determine from a desired operation of charging the battery system a desired value of a charging voltage and to output information about the desired value to a charging controller,
evaluate the sensor signals and/or an electric charging current used to charge the battery system and generate a corresponding evaluation result,
determine, by taking the desired operation of charging the battery system and the evaluation result into account, whether a predetermined criterion indicating a significant deviation from the desired operation is fulfilled and control an electric connection from the battery system to a secondary side receiving device of an inductive power transfer system, the receiving device functioning as a charger charging the battery system, to be switched off.

17. A vehicle comprising:
an on-board electric network,
the apparatus of claim 7, wherein the battery system is electrically connected to the electric network, and
a charger for charging the battery system.

\* \* \* \* \*